(12) United States Patent
Yagi et al.

(10) Patent No.: US 6,544,818 B2
(45) Date of Patent: Apr. 8, 2003

(54) METHOD OF MANUFACTURING SEMICONDUCTOR DEVICE

(75) Inventors: Yuji Yagi, Osaka (JP); Takeo Yasuho, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/801,926

(22) Filed: Mar. 9, 2001

(65) Prior Publication Data

US 2001/0053564 A1 Dec. 20, 2001

(30) Foreign Application Priority Data

Mar. 13, 2000 (JP) ........................................ 2000-068318

(51) Int. Cl.[7] .............................................. H01L 21/44
(52) U.S. Cl. ........................ 438/118; 438/108; 438/127
(58) Field of Search ................................. 438/118, 112, 438/124, 126, 127, 108

(56) References Cited

U.S. PATENT DOCUMENTS

| 5,817,542 | A | * | 10/1998 | Sakemi | 438/108 |
| 6,053,395 | A | * | 4/2000 | Sasaki | 228/180.22 |
| 6,054,171 | A | * | 4/2000 | Shoji | 427/96 |
| 6,069,024 | A | * | 5/2000 | Murakami | 438/108 |
| 6,197,612 | B1 | * | 3/2001 | Watanabe | 438/106 |
| 6,197,617 | B1 | * | 3/2001 | Ohuchi et al. | 438/118 |
| 6,201,707 | B1 | * | 3/2001 | Sota | 361/761 |
| 6,218,736 | B1 | * | 4/2001 | Yagi et al. | 257/778 |
| 6,335,563 | B1 | * | 1/2002 | Hashimoto | 257/632 |

* cited by examiner

*Primary Examiner*—Kamand Cuneo
*Assistant Examiner*—Scott B. Geyer
(74) *Attorney, Agent, or Firm*—McDermott, Will & Emergy

(57) ABSTRACT

The method of manufacturing a semiconductor device comprising: forming a wiring pattern on a substrate; forming a thermosetting resin layer on the substrate; aligning and adhering a semiconductor chip to the wiring pattern for electric connection via the thermosetting resin layer; and press-bonding an electrode of the chip onto the wiring pattern while the chip is being heated. During the press-bonding step, the substrate is cooled. By the cooling, the amount of thermal expansion of the substrate is suppressed and therefore comes closer to the thermal expansion of the chip. By mounting the chip on the substrate through the steps described above, the reliability of moisture resistance of the semiconductor device is greatly improved.

18 Claims, 7 Drawing Sheets

0 - 5 sec.

after 5 sec.

0 - 5 sec.

after 5 sec.

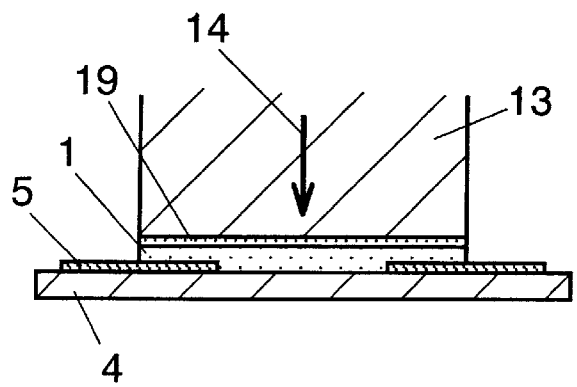
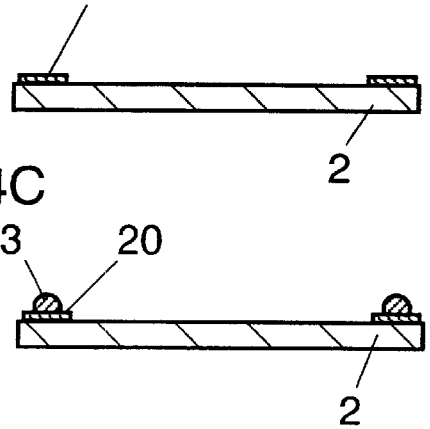
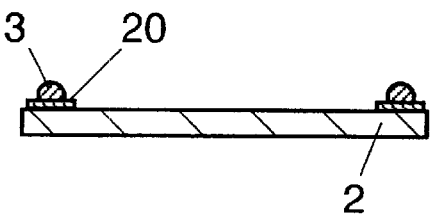
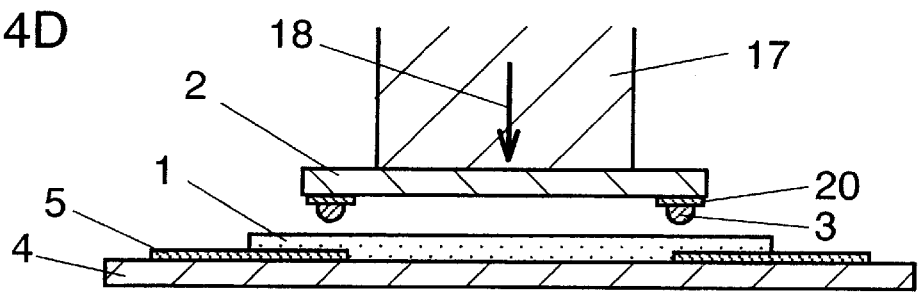
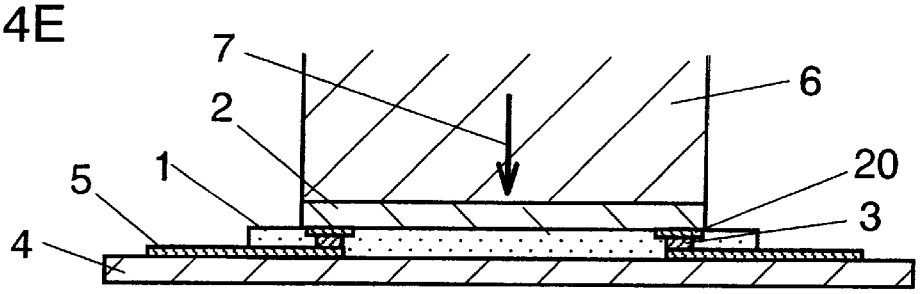

METHOD OF MANUFACTURING SEMICONDUCTOR DEVICE

FIELD OF THE INVENTION

The present invention relates to a method of manufacturing a semiconductor device, and more particularly relates to a manufacturing method employing a thermosetting resin for packaging of the semiconductor device.

BACKGROUND OF THE INVENTION

In a semiconductor market thick with competition, a semiconductor device is becoming smaller and cheaper. Encouraging the trend, much attention has now focused on mounting methods using a thermosetting resin in the mounting process of a semiconductor device. A thermosetting resin realizes fine pitch pattern mounting and easy processing. Above all, the most popular method is the chip mounting using an anisotropic conductive resin in which conductive particles disperse in the resin. Two different forms of the resin, anisotropic conductive films (called generally ACF) and anisotropic conductive paste (called generally ACP), are generally used for this mounting.

As shown in FIGS. 8A–8D, a conventional mounting process using such materials includes:

forming a layer of anisotropic conductive resin (thermosetting resin) (elements 11a and 11b) onto a substrate by either:
  i) temporary press-bonding anisotropic conductive film 11a onto a substrate (FIG. 8A) or
  ii) applying anisotropic conductive paste 11b on a substrate (FIG. 8B);

mounting semiconductor chip 2 on substrate 4 so as to align to the printed pattern thereon (FIG. 8C);

heating and press-bonding semiconductor chip 2 (FIG. 8D).

In the conventional mounting, however, the reliability of moisture resistance has not been sufficiently obtained due to lack of absolute contact between the semiconductor chip and the thermosetting resin.

That is, when heating and press-bonding in the step 8D, the chip and the substrate expand both by heat. At this moment, as a coefficient of linear expansion of the chip material differs from that of the substrate material, the difference causes a distortion at bonded portion by the time the chip and the substrate cool down to a normal temperature. As a result, a crack appears between the chip and the resin, or the substrate and the resin, permitting water intrusion, thereby the absolute contact of the resin to the chip or the substrate is hampered.

The present invention addresses the problem above. It is therefore an object of the present invention to provide an improved method of manufacturing a semiconductor device using a thermosetting resin by minimizing a distortion generated during the heating and press-bonding process. The method eliminates a crack between the chip and the resin, or the substrate and the resin, thus the reliability of moisture resistance is greatly improved.

SUMMARY OF THE INVENTION

The method of manufacturing a semiconductor device of the present invention comprises steps of:

i) forming a wiring pattern on a substrate;
ii) forming a thermosetting resin layer over the substrate so that the whole wiring pattern is covered therewith;
iii) aligning the electrode disposed on the bottom of the semiconductor chip for electric connections to the wiring pattern via the thermosetting resin layer; and
iv) press-bonding the electrode onto the substrate by applying heat from upper side of the chip, while the substrate is cooled.

According to the present invention, the substrate is cooled during the press-bonding step, so that the amount of thermal expansion of the substrate is suppressed. The material forming the substrate has a coefficient of linear expansion larger than that of the chip. By cooling the substrate, the difference between the amount of thermal expansion of the substrate and that of the chip becomes small. This reduces the distortion in the bonding layer, eliminating any crack that might develop between the chip and the resin, or between the substrate and the resin. As a result, the reliability of moisture resistance in the semiconductor device is greatly improved.

BRIEF DESCRIPTION OF THE DRAWINGS

FIG. 4 is a cross-sectional view showing a method of manufacturing a semiconductor device in accordance with a sixth preferred embodiment of the present invention.

DESCRIPTION OF THE PREFERRED EMBODIMENTS

The preferred embodiments of the present invention are described hereinafter with reference to the accompanying drawings, FIG. 1 through FIG. 7.

First Preferred Embodiment

The mounting process of a semiconductor device explained in the present embodiment is almost the same as the conventional one shown in FIG. 8 with one exception, i.e. the step where the semiconductor chip is press-bonded onto the substrate with application of heat.

Now will be described the heating and press-bonding step with reference to the drawings.

Figure 1:
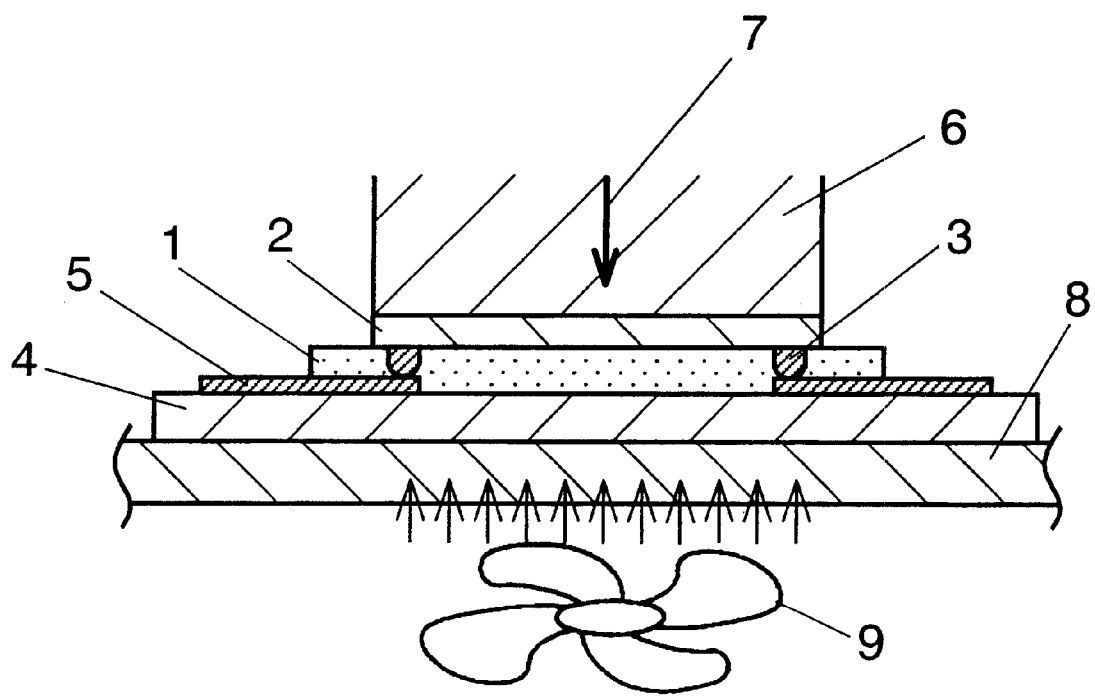
FIG. 1 is a cross-sectional view showing a step where a semiconductor chip is press-bonded by heat onto a substrate in accordance with a first preferred embodiment of the present invention.

FIG. 1 is a cross-sectional view showing a step in which a semiconductor chip is press-bonded onto a wiring pattern on a substrate with application of heat. FIG. 1 shows thermosetting resin 1, semiconductor chip 2, bump 3, substrate 4, wiring pattern 5, thermal press-bonding head 6, stage 8, and cooling device 9. Arrow 7 indicates a load for press-bonding.

As shown in FIG. 1, in the heating and press-bonding step of the present embodiment, substrate 4 is cooled by cooling device 9 from a lower side of stage 8, while thermosetting resin is press-bonded by heat.

Generally, the coefficient of linear expansion of a semiconductor chip is approx. 3.5 ppm/°C., while that of a substrate is at least 10 ppm/°C. Therefore, if heated equally, the substrate expands longer than the chip. In the present embodiment, during applying heat from the chip side, the substrate is cooled from the lower side of stage 8. By the cooling, the difference between the amount of thermal expansion of the substrate and that of the chip becomes small. As a result, it eliminates a possible crack developed between the chip and the resin layer, or between the substrate and the resin layer. And, the reliability of moisture resistance in the semiconductor device is greatly improved.

Although a shape of a fan is illustrated as the cooling device in FIG. 1, other cooling devices known in the prior art, such as a coolant-circulated metal plate, a Peltier device, and a heat pipe, are also usable.

Though, according to the present embodiment, the substrate is cooled from lower side of the stage by a cooling device, another effective cooling method comprises forming the stage with a high heat conductive material, so that the stage serves as a heat sink enhancing the heat radiation from the substrate. Employing a coolant-circulated stage is also effective to cool the substrate.

Still another method comprises cooling the substrate prior to the press-bonding process where the thermosetting resin is press-bonded by heat.

Second Preferred Embodiment

The mounting process of a semiconductor device explained in the present embodiment is almost the same as the conventional one shown in FIG. 8 with one exception, the step where the semiconductor chip is press-bonded onto the substrate with application of heat.

Now will be described the heating and press-bonding step with reference to the drawings.

Figure 2A:
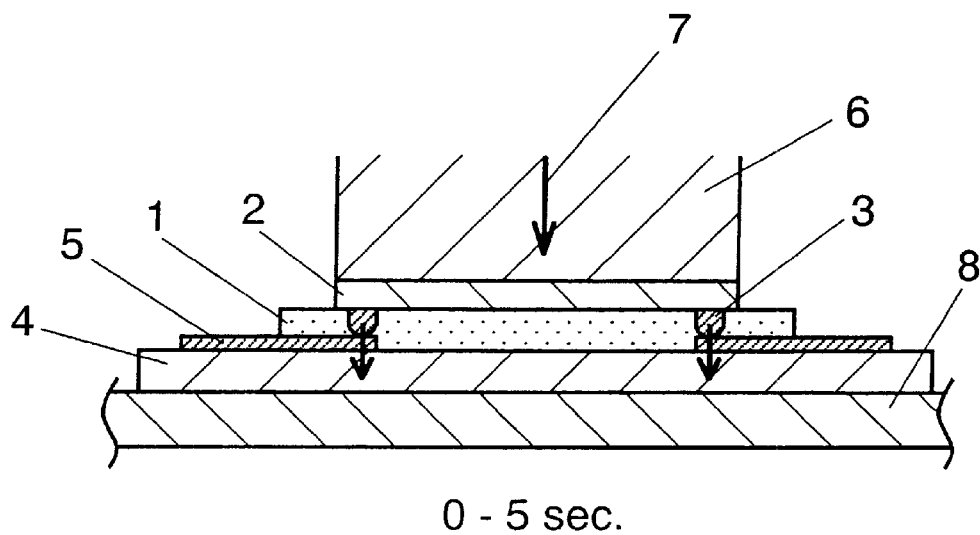
FIG. 2 is a cross-sectional view showing a step where a semiconductor chip is press-bonded by heat onto a substrate in accordance with a second preferred embodiment of the present invention.
Figure 2B:
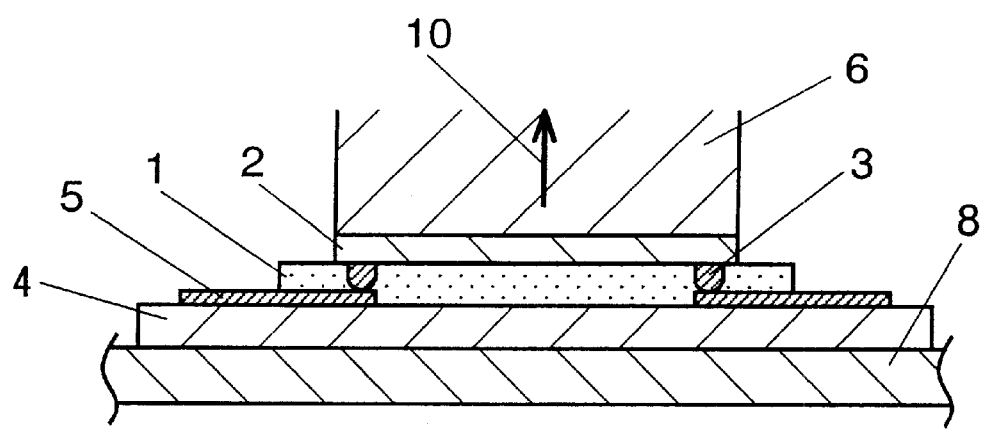
Figure 3A:
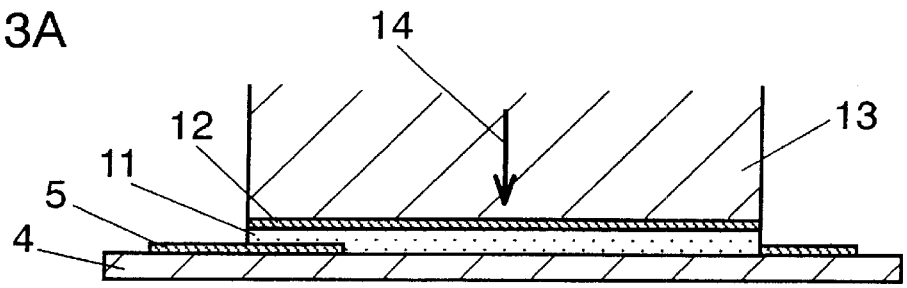
FIG. 3 is a cross-sectional view showing a method of manufacturing a semiconductor device in accordance with a fifth preferred embodiment of the present invention.
Figure 3B:
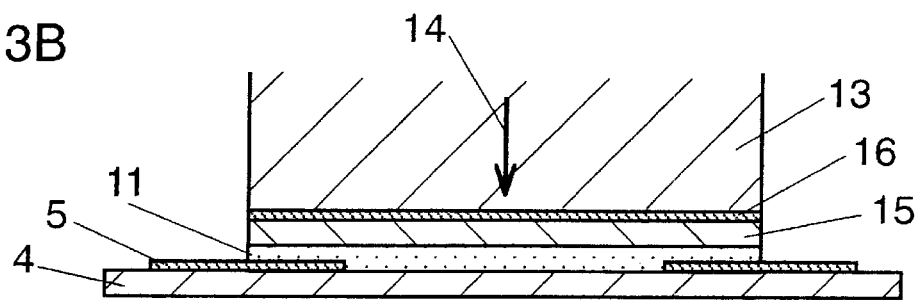
Figure 3C:
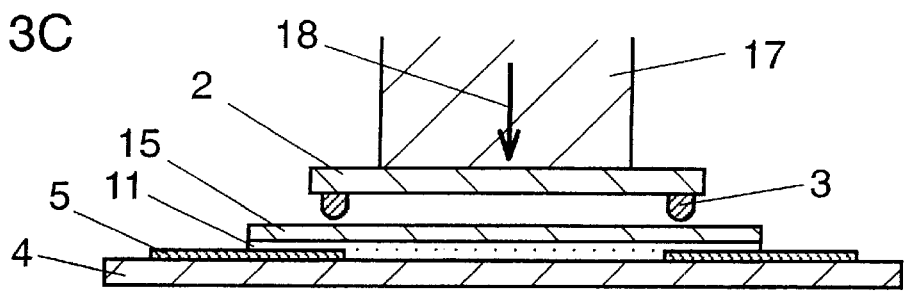
Figure 3D:
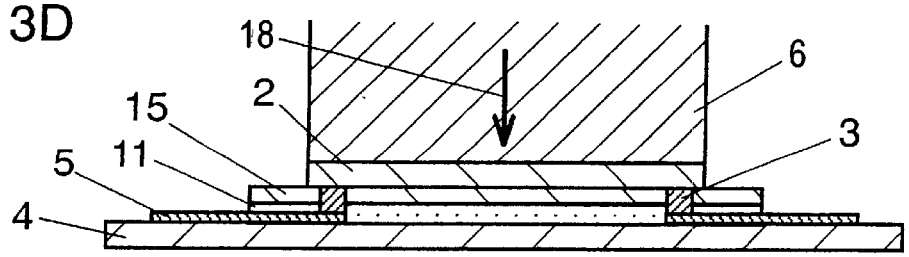

FIGS. 2A and 2B are cross-sectional views showing the steps in which a semiconductor chip is press-bonded onto a wiring pattern on a substrate with application of heat. In FIGS. 2A and 2B, arrow 10 indicates the moving direction of the thermal press-bonding head.

As shown in FIGS. 2A and 2B, according to the present embodiment, the heating and press-bonding step of the semiconductor chip comprises two stages below.

(a) press-bonding semiconductor chip 2, heating it at the same time, onto the wiring pattern by applying predetermined load 7 for a first 5 seconds, the load 7 being a weight enough to connect bump 3 formed on chip 2 with wiring pattern 5 on substrate 4.

(b) heating chip 2 after the 5-second press-bonding, while load 7 is gradually released, until the thermosetting resin cures at least 95% of complete curing.

Under heating and loading conditions specified in the present embodiment, the thermosetting resin usually begins curing in 5 seconds after the initiation of heating and pressing. By gradual unloading while the resin cures, a distortion developed at the bump on the chip is released by the time the resin cures. This eliminates a crack between the chip and the resin layer, or between the substrate and the resin layer, with the reliability of moisture resistance in the semiconductor device greatly improved.

Third Preferred Embodiment

The mounting process of a semiconductor device explained in the present embodiment is almost the same as the conventional one shown in FIG. 8. The sole difference being that a heat treatment is applied to the thermosetting resin after the chip underwent the heating and press-bonding step. The resin undergoes the heat treatment at a temperature lower than 150° C. before the temperature of the resin lowers to room temperature. Applying the treatment after the heating and press-bonding step allows the resin to cure almost completely, promising an improved reliability of moisture resistance in the semiconductor device.

In this process, the timing of applying the heat treatment is the key to obtaining a good result. That is, if the resin is heated again by the heat treatment after the temperature of the resin lowers to a room temperature, a thermal impact from the heat treatment degrades the performance reliability of the semiconductor device. To avoid this, in the embodiment, the resin undergoes the heat treatment while the temperature of the resin is high enough.

In order to realize the process of the present embodiment, it is effective to install a reflow furnace for the heat treatment in the production line next to a machine for heating/press-bonding the chip. With such an installation, the heating/press-bonding and the heat treatment are performed in one production line, allowing the thermosetting resin to undergo the heat treatment with a high temperature maintained.

Fourth Preferred Embodiment

The mounting process of a semiconductor device explained in the present embodiment is almost the same as the conventional one shown in FIG. 8 with one exception. The difference being that: the heating/press-bonding for the chip is done thoroughly until the thermosetting resin cures 90% of complete cure; then load 7 is gradually released, and the heat treatment is applied to the resin so that the resin cure more than 95% of complete cure under reduced or no load.

According to the method of the present embodiment, as described above, the resin is gradually released from the load before curing completely then it undergoes the heat treatment. The process releases a distortion developed in the resin by the time the resin completely cures. This therefore prevents a crack between the chip and the resin layer, or between the substrate and the resin layer, with the reliability of moisture resistance in the semiconductor device greatly improved.

Fifth Preferred Embodiment

The method of manufacturing a semiconductor device and the semiconductor device manufactured with the method of the present embodiment are described with reference to the accompanying drawings.

FIGS. 3A–3D are cross-sectional views showing a method of manufacturing a semiconductor device of the present embodiment, showing anisotropic conductive resin layer 11, anisotropic conductive resin protection sheet 12, temporary press-bonding head 13, insulating resin layer 15, insulating resin protection sheet 16, and mounting head 17. Arrow 14 indicates the load for temporary press-bonding, while arrow 18 indicates the moving direction of mounting head 17.

As illustrated in the FIGS., the manufacturing method of the present embodiment includes:

(a) forming an anisotropic conductive resin layer 11 over the surface of substrate 4;

(b) forming insulating resin layer 15 over layer 11;

(c) adhering semiconductor chip 2 on the predetermined position of substrate 4 with layer 15; and (d) press-bonding chip 2 onto a wiring pattern 5 on substrate 4 with application of heat.

In the semiconductor device manufactured through the steps above, the anisotropic conductive resin layer containing conductive particles for reliable electric connections between the bump formed on the chip and the wiring pattern on the substrate is formed on the substrate. The insulating resin layer having no conductive particles and having good adhesive abilities is formed on the semiconductor chip surface, where a crack due to a relatively poor adhesion with the resin often occurs. Therefore, the insulating resin layer having no conductive particles and having good adhesive abilities is formed on the anisotropic conductive resin layer for absolute contact with no crack. With such a structure, the reliability of moisture resistance in the semiconductor device is greatly improved.

It is also effective to employ the two-layered film with the anisotropic conductive resin and the insulating resin for the above purpose. In this case, the two-layered film is disposed on the substrate with the anisotropic conductive resin layer-side faced to the substrate, and the chip is mounted on the insulating resin layer-side, then heated and press-bonded.

Sixth Preferred Embodiment

The method of manufacturing a semiconductor device and the semiconductor device manufactured with the method of the present embodiment are described with reference to the accompanying drawings.

FIGS. 4A–4E are cross-sectional views showing the method of manufacturing the semiconductor device of the present embodiment. In the Figures, the same reference signs have been retained for similar parts described in previous embodiments. In addition to them, thermosetting resin protection sheet 19 and gold-plated layer 20 are shown.

As shown in FIGS 4A–4E, the manufacturing method of the present embodiment includes:
 (a) forming thermosetting resin layer 1 over the surface of substrate 4;
 (b) forming gold-plated layer 20 over an aluminum electrode on semiconductor chip 2;
 (c) forming bump 3 on the gold-plated aluminum electrode;
 (d) aligning chip 2 so that bump 3 fits with the predetermined position of wiring pattern 5 on substrate 4, and adhering chip 2 onto substrate 4 with thermosetting resin layer 1; and
 (e) press-bonding chip 2 onto wiring pattern 5 on substrate 4 with application of heat.

Some currently used chips tested for reliability of moisture resistance experience break due to corrosion at the aluminum electrode on the chip. According to the method of the present embodiment, the semiconductor device has gold-plated electrode, being free from corrosion.

Seventh Preferred Embodiment

The substrate employed for the present embodiment will be described with reference to accompanying drawings.

Figure 5:
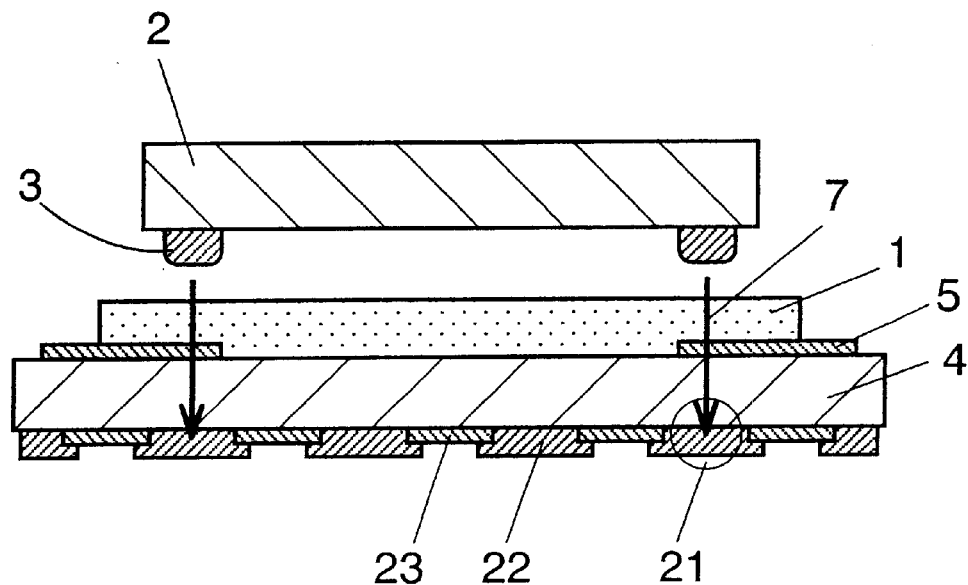
FIG. 5 is a cross-sectional view showing a substrate of the semiconductor device in accordance with a seventh preferred embodiment of the present invention.

FIG. 5 is a cross-sectional view showing a substrate of a semiconductor device of the present embodiment, showing protrusion 21, resist 22, and land 23 for external connection.

As shown in FIG. 5, load 7 is applied to wiring pattern 5 on substrate 4 through bump 3 formed on chip 2 for press-bonding chip 2 onto substrate 4. Formed on the substrate's rear surface beneath wiring pattern 5, protrusion 21 protects the substrate from warp. This structure thus releases a distortion, eliminating a crack between the chip and the thermosetting resin, or the substrate and the resin, with the reliability of moisture resistance greatly improved.

Eighth Preferred Embodiment

The substrate employed for the present embodiment will be described with reference to accompanying drawings.

Figure 6:
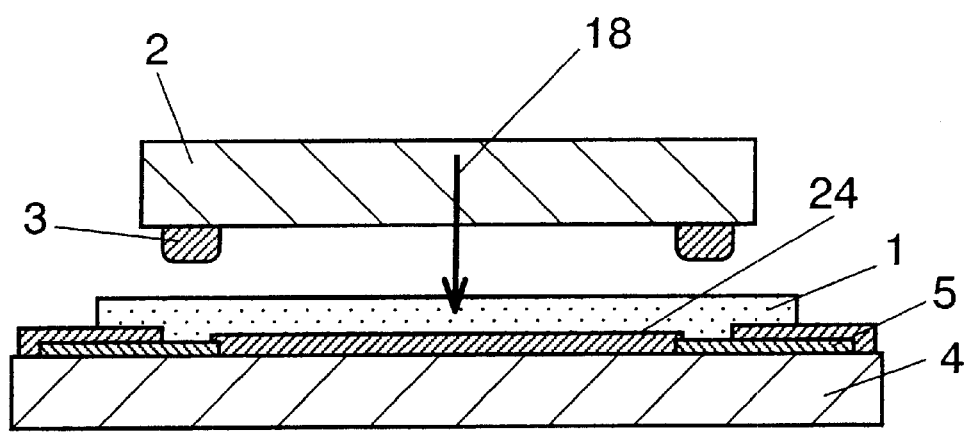
FIG. 6 is a cross-sectional view showing a substrate of the semiconductor device in accordance with an eighth preferred embodiment of the present invention.

FIG. 6 is a cross-sectional view showing the substrate used for the semiconductor device of the present embodiment. In FIG. 6, resin layer 24 is formed on substrate 4.

As shown in FIG. 6, substrate 4 is covered, except the portion connecting bump 3 on chip 2 to the substrate 4, with resin layer 24 such as a solder resist to level the surface of substrate 4.

The structure described above minimizes air bubbles generated between the thermosetting resin and the substrate while the thermosetting resin in the anisotropic conductive resin layer moves around when it cures. Therefore, the reliability of moisture resistance is greatly improved.

Ninth Preferred Embodiment

The substrate used for the present embodiment will be described with reference to accompanying drawings.

Figure 7:
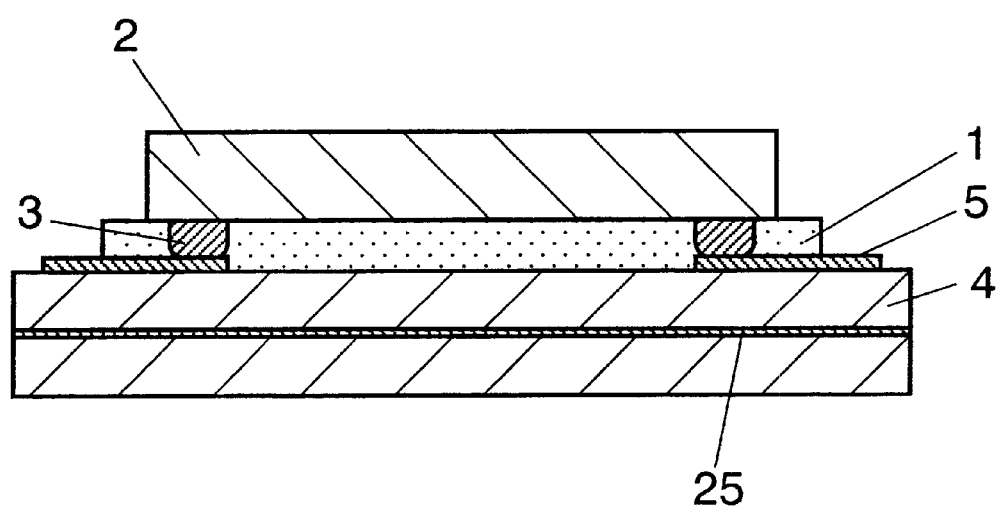
FIG. 7 is a cross-sectional view showing a substrate of the semiconductor device in accordance with a ninth preferred embodiment of the present invention.
Figure 8A:
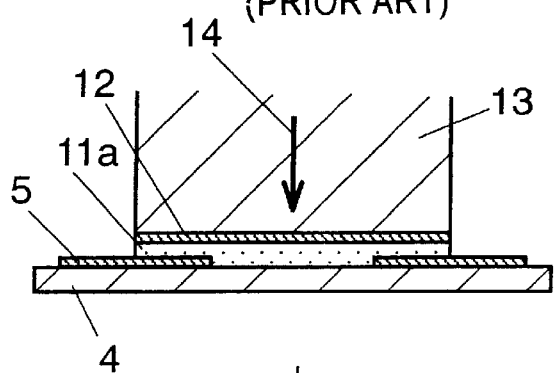
FIG. 8 is a cross-sectional view showing the prior art method of manufacturing a semiconductor device.
Figure 8B:
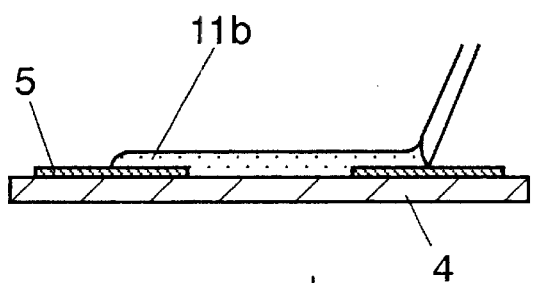
Figure 8C:
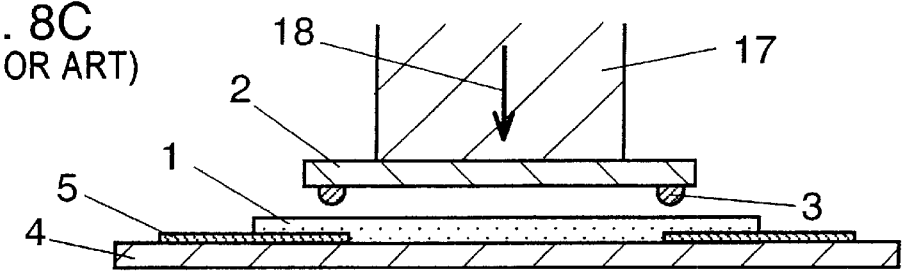
Figure 8D:
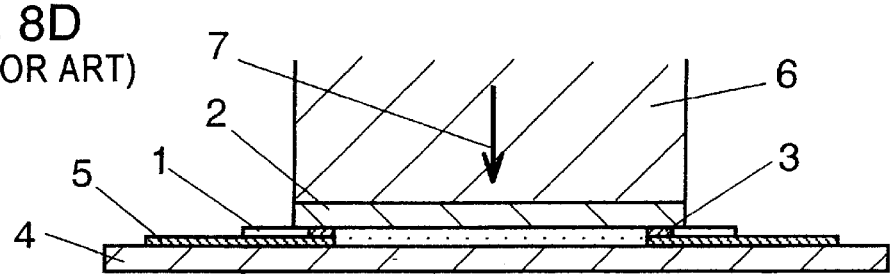

FIG. 7 is a cross-sectional view showing the substrate of the semiconductor device of the embodiment. In FIG. 7, layer 25 is formed within substrate 4.

As shown in FIG. 7, the substrate of the present embodiment sandwiches layer 25 made of such materials as nickel, zinc, molybdenum, which have a coefficient of linear expansion smaller than that of substrate 4. Besides, a material with a coefficient of linear expansion being close to that of the chip is preferable for the materials to be sandwiched.

By having a coefficient of linear expansion of the substrate close to that of the chip, a distortion is released, thereby preventing a crack between the chip and the thermosetting resin layer, or between the substrate and the resin layer. This provides an improved reliability of moisture resistance.

Although the manufacturing method of the present invention, as shown in accompanying drawings, focuses on the case in which the thermosetting resin layer is formed on the substrate, it is also effective and applicable to the semiconductor device that is formed by sealing with, for example, underfill, between the chip and the substrate.

According to the method of manufacturing semiconductor device of the present invention, the substrate is kept cool while the thermosetting resin undergoes the heating and press-bonding to suppress a temperature rise of the substrate. The cooling allows a thermal expansion of the substrate to be close to that of the semiconductor chip, minimizing a distortion in the thermosetting resin. As a result, a crack between the chip and the thermosetting resin, or between the substrate and the resin layer is eliminated, with the reliability of moisture resistance greatly improved.

What is claimed is:

1. A method of manufacturing a semiconductor device comprising steps of:
 (a) forming a wiring pattern on a substrate;
 (b) forming a layer of thermosetting resin on the substrate so as to cover the wiring pattern;
 (c) adhering a semiconductor chip onto a predetermined position on the substrate with the thermosetting resin; and
 (d) press-bonding an electrode of the chip onto the wiring pattern while a heat is applied from upper side of the chip,
 wherein the substrate is cooled while the chip is heated during the step (d).

2. The method of manufacturing the semiconductor device of claim 1 wherein a step of cooling the substrate is added prior to the step (d).

3. The method of manufacturing the semiconductor device of claim 1 wherein the thermosetting resin layer is an anisotropic conductive resin.

4. The method of manufacturing the semiconductor device of claim 1 wherein the thermosetting resin layer comprises a two-layered structure with an anisotropic conductive resin layer and an insulating resin layer.

5. The method of manufacturing the semiconductor device of claim 4 wherein the anisotropic conductive resin layer faces to the substrate and the insulating resin layer faces to the chip.

6. The method of manufacturing the semiconductor device of claim 1 wherein the method further comprises the steps of:
   plating the electrode with gold; and
   forming a bump on the gold-plated electrode.

7. The method of manufacturing the semiconductor device of claim 1 wherein the substrate has a protrusion on its rear surface beneath the electrode.

8. The method of manufacturing the semiconductor device of claim 1 wherein a top surface of the substrate is leveled with a resin, except for a connecting portion of the electrode.

9. The method of manufacturing the semiconductor device of claim 1 wherein the substrate include a layer made of a material having a coefficient of linear expansion smaller than that of a material forming the substrate.

10. The method of manufacturing a semiconductor device according to claim 1, wherein the step (d) includes the steps of:
    applying a load required to establish electric connections between the wiring pattern and the electrode for 5 seconds after the press-bonding has started; and
    reducing the load after the 5-seconds press-bonding.

11. The method of manufacturing a semiconductor device according to claim 1, further comprising the step of:
    after completion of the press bonding step, heat treating the thermosetting resin at a temperature lower than 150° C. before a temperature of the resin lowers to room temperature.

12. The method of manufacturing a semiconductor device according to claim 1, wherein the step (d) further comprises:
    a first curing stage of less than 90% curing of the thermosetting resin; and
    a second stage of more then 95% curing of the resin with the load removed.

13. A method of manufacturing a semiconductor device comprising steps of:
    (a) forming a wiring pattern on a substrate;
    (b) forming a layer of thermosetting resin on the substrate so as to cover the wiring pattern;
    (c) adhering a semiconductor chip onto a predetermined position on the substrate with the thermosetting resin;
    (d) press-bonding an electrode of the chip onto the wiring pattern while a heat is applied from upper side of the chip,
    wherein the step (d) further comprises the steps of:
       press-bonding the chip onto the substrate by applying a load required to establish electric connections between the wiring pattern and the electrode for 5 seconds after the press-bonding has started; and
       reducing the load after the 5-seconds press-bonding.

14. The method of manufacturing the semiconductor device of claim 13 wherein the load is continuously reduced until the thermosetting resin cures at least 95% of complete cure.

15. A method of manufacturing a semiconductor device comprising the steps of:
    (a) forming a wiring pattern on a substrate;
    (b) forming a layer of thermosetting resin on the substrate so as to cover the wiring pattern;
    (c) adhering a semiconductor chip onto a predetermined position on the substrate with the thermosetting resin;
    (d) press-bonding an electrode of the chip onto the wiring pattern while a heat is applied from upper side of the chip, and
    (e) after the press-bonding step, heat treating the thermosetting resin at a temperature lower than 150° C. before a temperature of the resin lowers to room temperature.

16. The method of manufacturing the semiconductor device of claim 15 wherein the press-bonding step and the heat treatment are processed in one production line.

17. The method of manufacturing the semiconductor device of claim 16 wherein the heat treatment is performed by a reflow furnace.

18. A method of manufacturing a semiconductor device comprising steps of:
    (a) forming a wiring pattern on a substrate;
    (b) forming a layer of thermosetting resin on the substrate so as to cover the wiring pattern;
    (c) adhering a semiconductor chip onto a predetermined position on the substrate with the thermosetting resin; and
    (d) press-bonding an electrode of the chip onto the wiring pattern while a heat is applied from upper side of the chip,
    wherein the step (d) further comprises:
       a first curing stage of less than 90% curing of the thermosetting resin; and
       a second stage of more than 95% curing of the resin with the load removed.

* * * * *